(12) United States Patent
Chen

(10) Patent No.: US 7,841,860 B1
(45) Date of Patent: Nov. 30, 2010

(54) COMPENSATING CIRCUIT BOARD CONNECTOR

(75) Inventor: Wen-Hsiung Chen, Taipei (TW)

(73) Assignee: Compupack Technology Co., Ltd., Taipei (TW)

( * ) Notice: Subject to any disclaimer, the term of this patent is extended or adjusted under 35 U.S.C. 154(b) by 0 days.

(21) Appl. No.: 12/559,706

(22) Filed: Sep. 15, 2009

(51) Int. Cl.
*H01R 12/00* (2006.01)
(52) U.S. Cl. ......................................... 439/65; 439/513
(58) Field of Classification Search ................... 439/65, 439/507–514
See application file for complete search history.

(56) References Cited

U.S. PATENT DOCUMENTS 6,299,469 B1 * 10/2001 Glovatsky et al. ........... 439/329
7,203,074 B1 * 4/2007 Yaung et al. ................. 361/784
7,618,283 B1 * 11/2009 Costello ...................... 439/511

* cited by examiner

*Primary Examiner*—Gary F. Paumen
(74) *Attorney, Agent, or Firm*—Roger H. Chu

(57) ABSTRACT

A compensating circuit board connector for connecting two adjacent circuit boards includes two sockets and a jumper. Each socket includes at least one receiving terminal having a conducting portion with two opposite sidewalls. The sockets are disposed on the circuit boards, respectively, so the conducting portions of the receiving terminals of the sockets jointly form an accommodating space. The jumper is mated with the sockets and includes at least one jumper terminal. The jumper terminal, configured for being received in the accommodating space, includes a frame and two resilient portions. The frame, narrower than a spacing between the opposite sidewalls of each receiving terminal, extends through the conducting portions of the receiving terminals of the sockets. The resilient portions, provided respectively at two ends of the frame, extend outward to each press against the opposite sidewalls of the corresponding receiving terminal, thereby electrically connecting the receiving terminals of the sockets.

12 Claims, 7 Drawing Sheets

COMPENSATING CIRCUIT BOARD CONNECTOR

BACKGROUND OF THE INVENTION

1. Technical Field

The present invention relates to an electronic connector and, more particularly, to a compensating circuit board connector.

2. Description of Related Art

An electronic device is provided therein with a circuit system for realizing specific functions. The electronic circuits of such a device are usually integrated into one or more printed circuit boards. When the circuits are distributed on several circuit boards, conducting wires or connectors are required for connecting transmission-line networks of the circuit boards. For example, a large light-emitting diode (LED) bulletin board is composed of a plurality of circuit boards equipped with LEDs, and the adjacent circuit boards are connected by circuit board connectors to make a complete circuit system.

Taiwan Patent No. M353514 discloses a circuit board connector as shown in FIG. 1 through FIG. 4, wherein FIG. 1 is a perspective view of the circuit board connector of the prior art, and FIG. 2 to FIG. 4 are perspective views of a socket, a jumper, and a jumper terminal of the circuit board connector of the prior art, respectively. This conventional circuit board connector 10 is formed by two sockets 12, 13 and a jumper 11. The sockets 12, 13 have the same structure and are disposed on adjacent circuit boards, respectively. Each of the sockets 12, 13 is provided with a plurality of receiving terminals 122, 132. The jumper 11 is mated with the sockets 12, 13 and provided with a plurality of jumper terminals 111 for electrically connecting the corresponding receiving terminals 122, 132 of the sockets 12, 13.

The socket 12 includes an insulating seat 120. The insulating seat 120 is provided with a plurality of receiving grooves 121 arranged at intervals so as to receive the receiving terminals 122, respectively. On the other hand, the jumper 11 includes an insulating cover 110 for receiving the jumper terminals 111. As shown in the drawings, each receiving terminal 122 is provided with clamping plates while each jumper terminal 111 has a plate-shaped structure. The jumper terminals 111 are tightly clamped by the corresponding receiving terminals 122 to realize the terminal mating structure of the circuit board connector 10.

Since circuit boards are cut to shape with machines, the actual dimensions of the finished circuit boards tend to deviate from design dimensions. In a system where circuit boards are connected to one another, the permissible variation in dimensions, or dimensional tolerance, of the circuit boards often causes a positional offset between corresponding components on the circuit boards; therefore, when the sockets of the conventional circuit board connector are disposed on adjacent circuit boards, respectively, an offset between the sockets is inevitable. However, the conventional circuit board connector does not allow for the generally existing positional offset between circuit boards and requires a tight fit between the terminals. When a relatively large positional offset exists between the two sockets of the conventional circuit board connector, the jumper mated with the sockets tends to pull the circuit boards through the sockets. As a result, socket solder points are very likely to fall off, thus damaging the circuits and impairing device performance. Even if the device does not fail during the manufacturing process, the damaged circuits will eventually reduce the service life of the device.

In view of the negative impacts of the terminal tight-fit design of the conventional circuit board connector on device reliability, the inventor of the present invention proposes a compensating circuit board connector to overcome the drawbacks of the prior art.

SUMMARY OF THE INVENTION

Therefore, it is an objective of the present invention to provide a compensating circuit board connector whose receiving terminals have conducting portions each composed of opposite sidewalls, and whose at least one jumper terminal has resilient portions pressing against the receiving terminals so as to electrically connect two sockets and compensate for a positional offset between the sockets.

The present invention discloses a compensating circuit board connector for connecting two adjacent circuit boards. The compensating circuit board connector includes two sockets and a jumper. Each of the two sockets includes at least one receiving terminal. The receiving terminal has a conducting portion and a connecting portion, wherein the conducting portion includes two opposite sidewalls. The two sockets are disposed respectively on the two circuit boards by means of the connecting portions of their respective receiving terminals, such that the conducting portions of the receiving terminals of the two sockets jointly form an accommodating space. The jumper is mated with the two sockets and includes at least one jumper terminal. The jumper terminal is configured for being received in the accommodating space and includes a frame and two resilient portions. The frame extends through the conducting portions of the receiving terminals of the two sockets and has a width smaller than a spacing between the two opposite sidewalls of the receiving terminal of each of the two sockets. The two resilient portions are provided at two ends of the frame, respectively, and extend outward such that each resilient portion presses against the two opposite sidewalls of the corresponding receiving terminal.

In the compensating circuit board connector disclosed by the present invention, the conducting portion of each receiving terminal is composed of the opposite sidewalls, and the resilient portions extending outward from the frame of the jumper terminal are configured to press against the receiving terminals and thereby electrically connect the two sockets at the two ends of the jumper terminal. Thus, a positional offset between the sockets can be compensated for to prevent the circuit boards from deforming as a result of an improper coupling force and to ensure device reliability.

The structure and technical means adopted by the present invention to achieve the above objective are demonstrated by the foregoing summary, the following detailed description, and the appended drawings. Other objectives and advantages of the present invention are further disclosed in the subsequent description and the drawings.

DETAILED DESCRIPTION OF THE INVENTION

The present invention provides a compensating circuit board connector for electrically connecting adjacent circuit boards and compensating for a positional offset between components caused by dimensional tolerances of the circuit boards.

Figure 1:
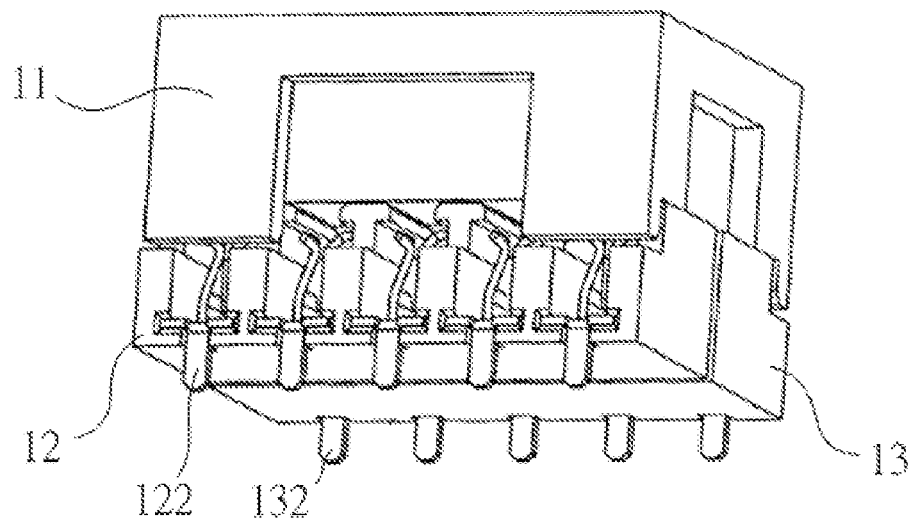
FIG. 1 is a perspective view of a conventional circuit board connector of a prior art.
Figure 2:
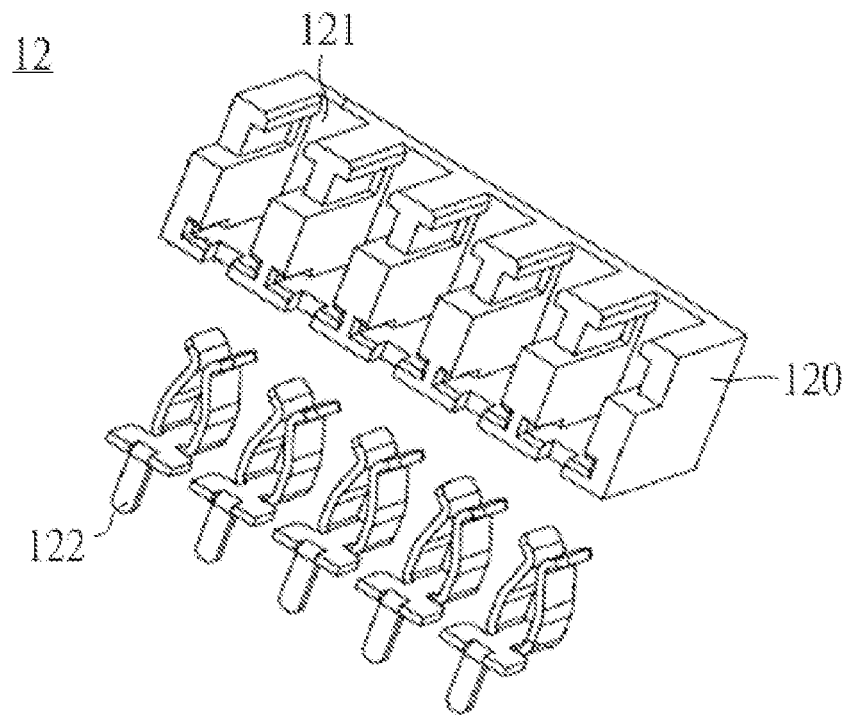
FIG. 2 is an exploded perspective view of a socket of the conventional circuit board connector of the prior art.
Figure 3:
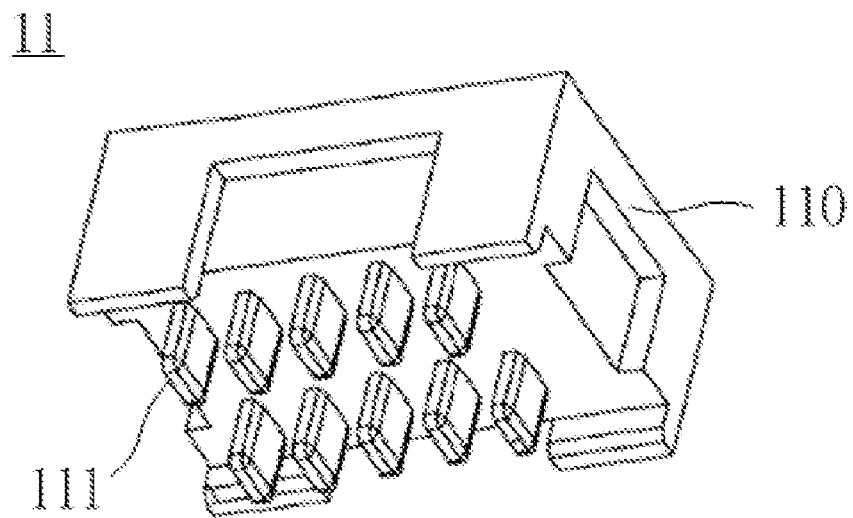
FIG. 3 is a perspective view of a jumper of the conventional circuit board connector of the prior art.
Figure 4:
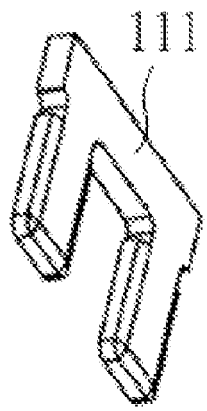
FIG. 4 is a perspective view of a jumper terminal of the conventional circuit board connector of the prior art.
Figure 5:
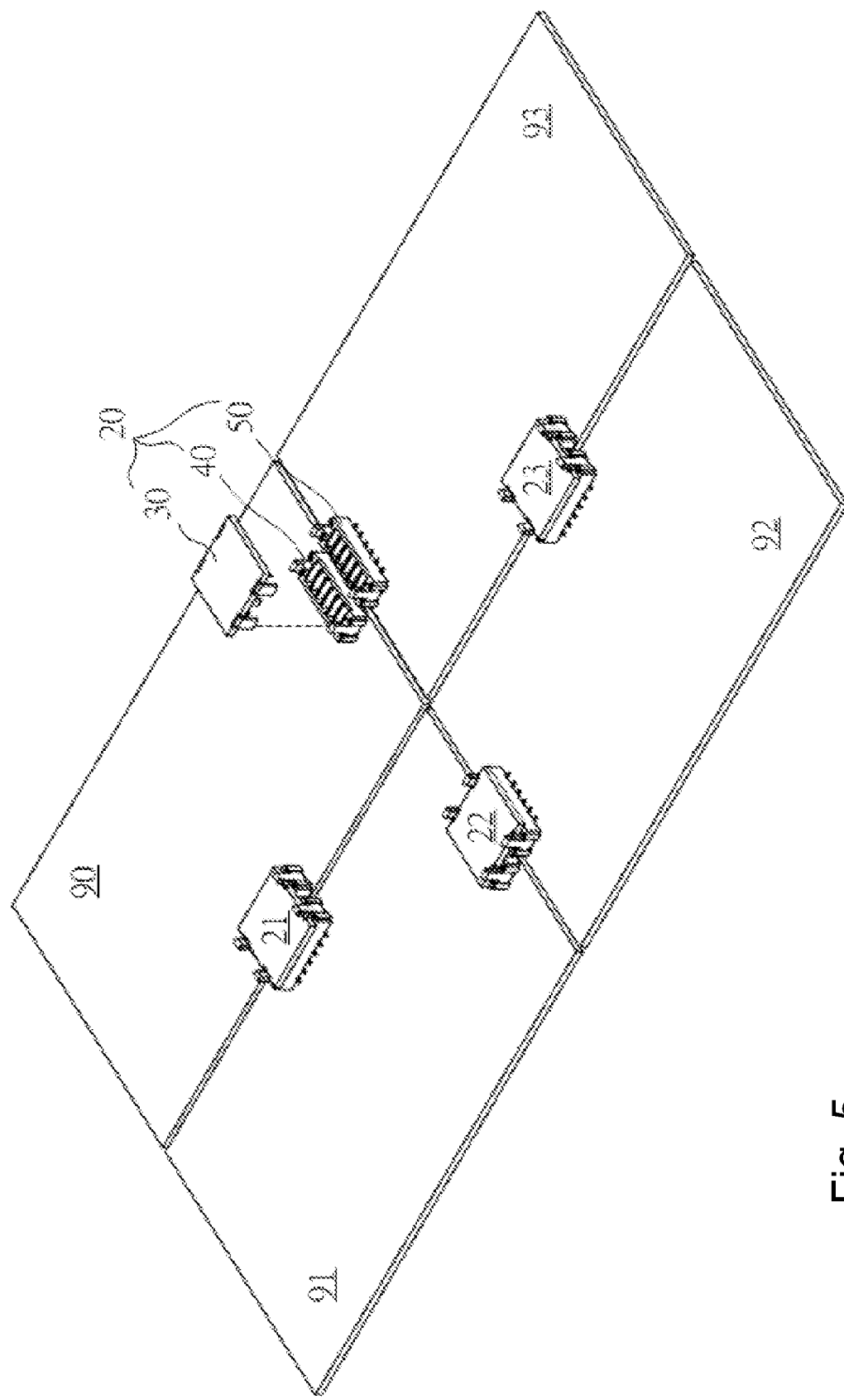
FIG. 5 is a perspective view showing application of a compensating circuit board connector according to the present invention.

Please refer to FIG. 5 for a perspective view showing application of the compensating circuit board connector according to the present invention. As shown in the drawing, circuit board connectors 20, 21, 22, 23 are provided at adjoining board edges of circuit boards 90, 91, 92, 93 to create an electrical connection therebetween. The circuit board connector 20 is composed of two sockets 40, 50 and a jumper 30. The sockets 40, 50 are disposed on the circuit boards 90, 93 and electrically connected to specific transmission lines, respectively. The jumper 30 is mated with the sockets 40, 50 so as to bridge the sockets 40, 50 and electrically connect the transmission lines coupled respectively thereto.

Generally, the electronic system design procedure for a device employing the present invention involves predetermining the locations of the sockets 40, 50, completing circuit layout, and then fabricating the circuit boards 90, 93. However, owing to dimensional tolerances of the circuit boards 90, 93, a positional offset between the sockets 40, 50 is inevitable. The circuit board connector 20 of the present invention uses a terminal mating structure of the jumper 30 and the sockets 40, 50 to compensate for the positional offset between the sockets 40, 50 caused by an assembly tolerance of the circuit boards 90, 93, thus preventing the circuit boards 90, 93 from being pulled by an improper coupling force.

Figure 6:
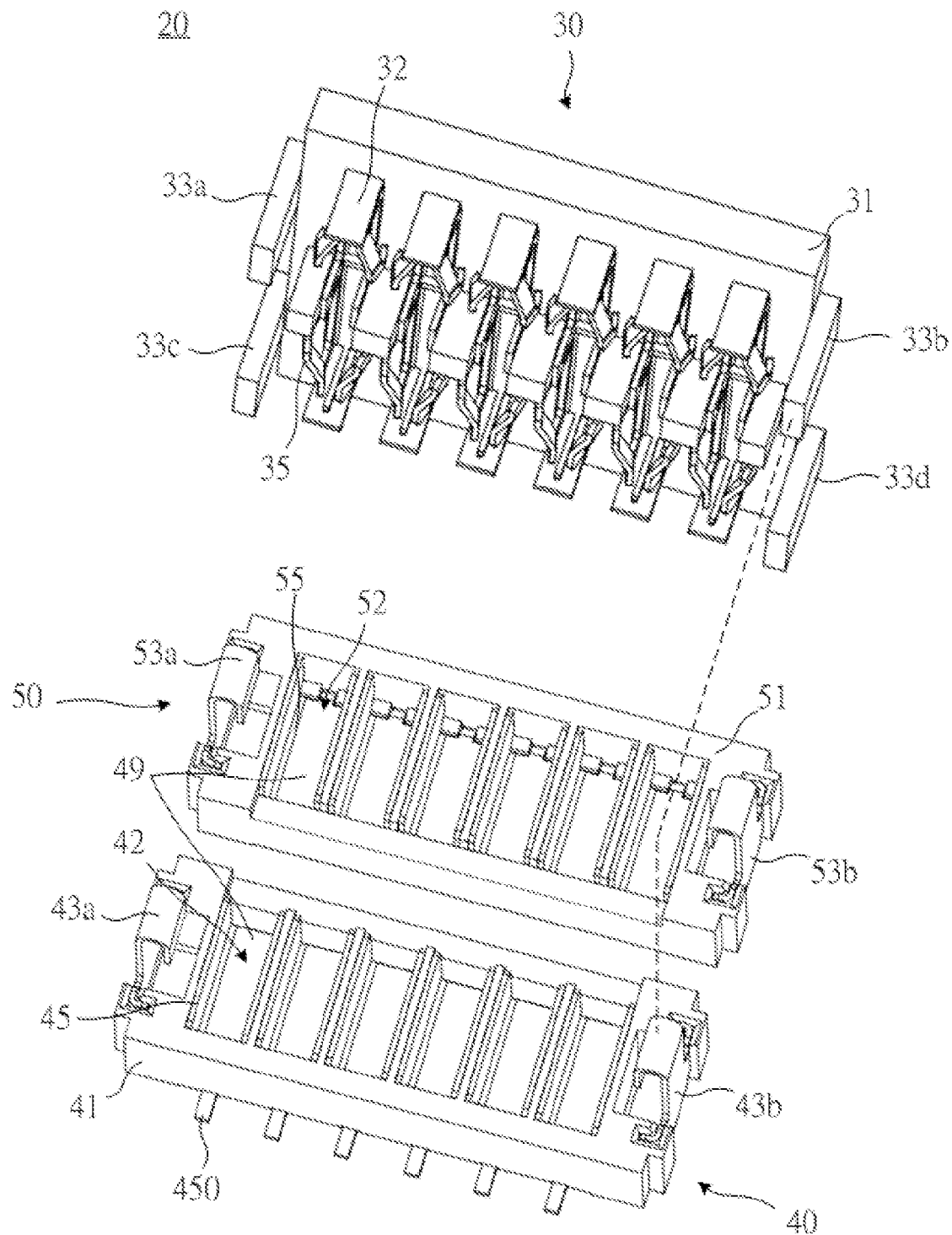
FIG. 6 is an exploded perspective view of an embodiment of the compensating circuit board connector according to the present invention.
Figure 7:
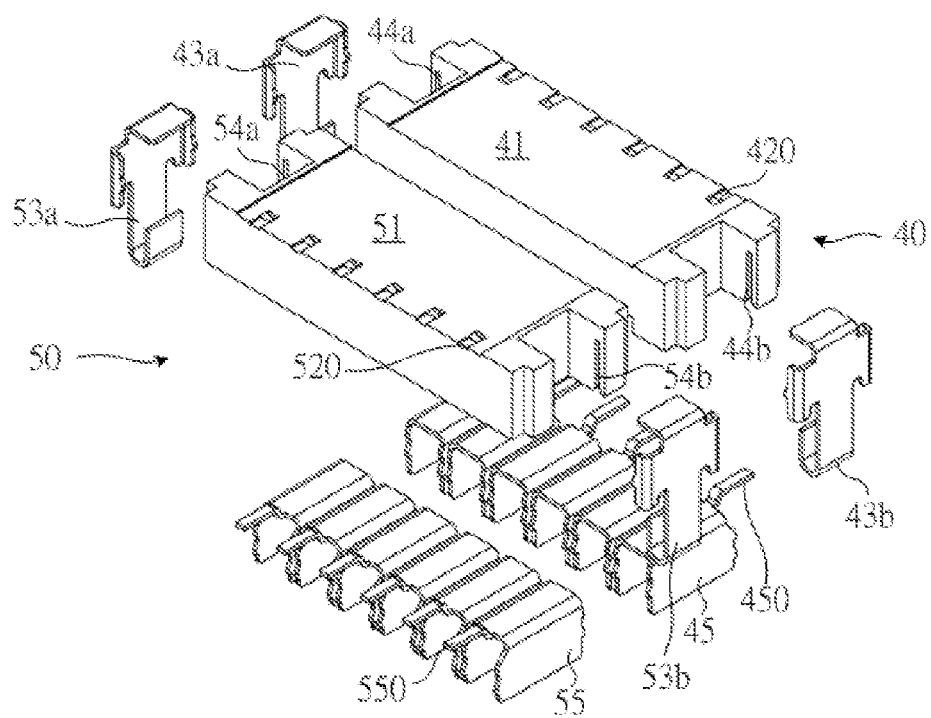
FIGS. 7 and 8 are exploded perspective views of two sockets of the compensating circuit board connector according to the present invention, taken from different viewing angles.
Figure 8:
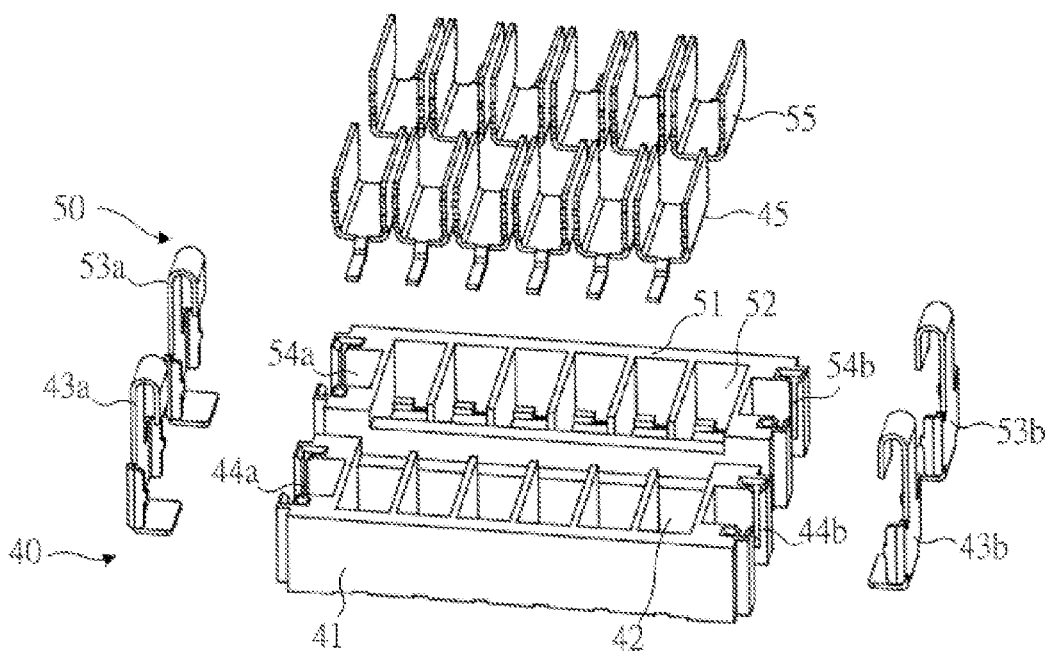
Figure 9:
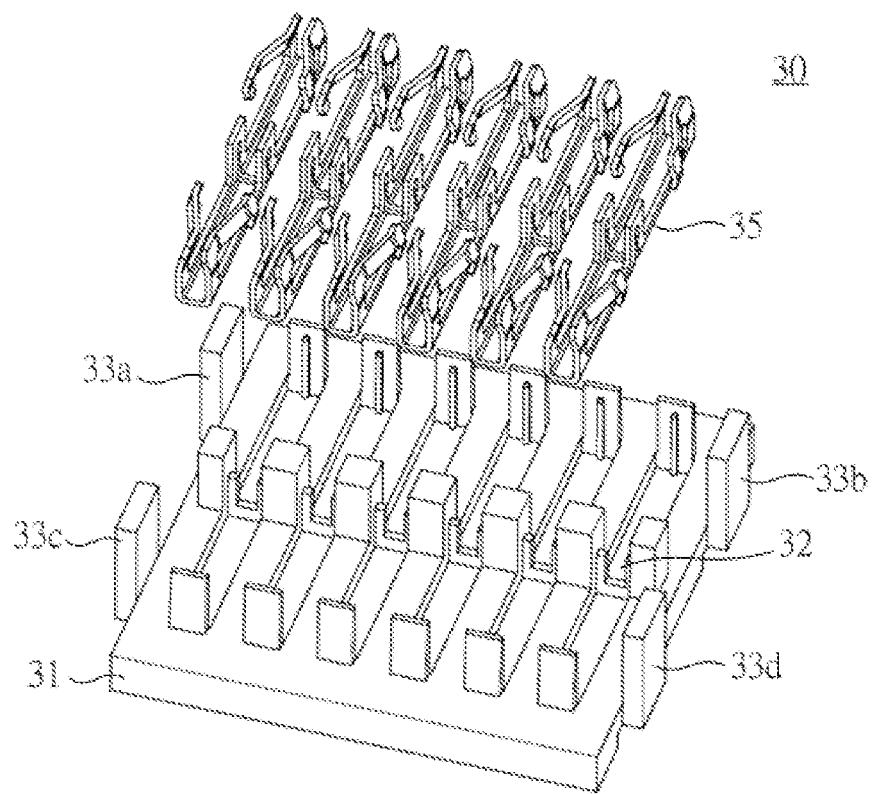
FIG. 9 is an exploded perspective view of a jumper of the compensating circuit board connector according to the present invention.
Figure 10:
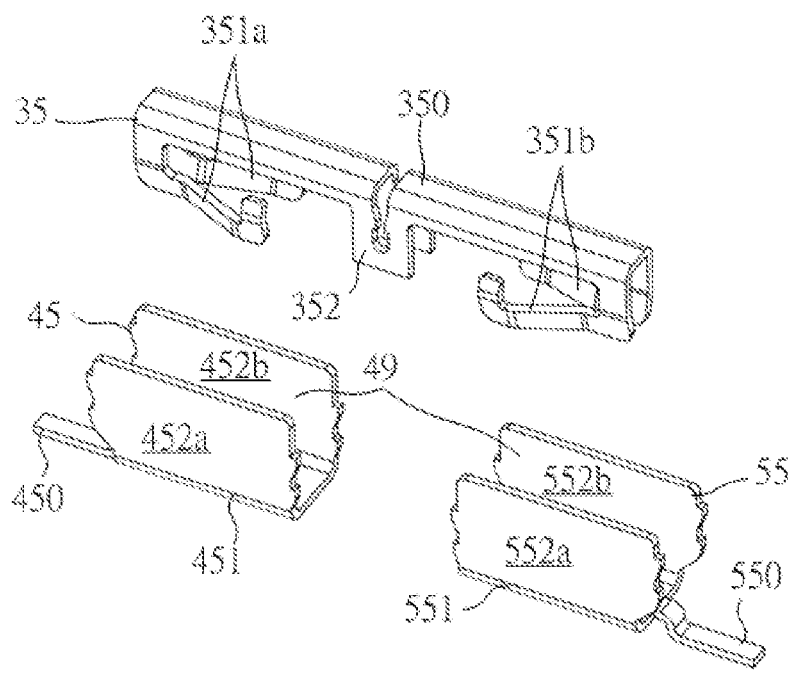
FIG. 10 is a perspective view of a jumper terminal and two receiving terminals of the compensating circuit board connector according to the present invention.

Structural features of the circuit board connector 20 are detailed hereinafter to explain how the present invention compensates for the positional offset. Please refer to FIGS. 6 through 10, wherein FIG. 6 is an exploded perspective view of an embodiment of the compensating circuit board connector 20 according to the present invention, FIGS. 7 and 8 are exploded perspective views of the sockets 40, 50 of the embodiment shown in FIG. 6 when observed from different viewing angles, FIG. 9 is an exploded perspective view of the jumper 30 shown in the embodiment of FIG. 6; and FIG. 10 is a perspective view of a jumper terminal and two receiving terminals according to the present invention.

The socket 40 includes an insulating seat 41, a plurality of receiving terminals 45, and two latches 43a, 43b. The insulating seat 41 is formed with a plurality of rectangular receiving grooves 42 arranged at intervals so as to secure the receiving terminals 45 in position, respectively. Each receiving terminal 45 is electrically conductive and includes a connecting portion 450 and a conducting portion 451. The connecting portion 450 is configured for electrically coupling with transmission lines of the circuit board 90. The conducting portion 451 is configured to substantially conform to the shape of the rectangular receiving groove 42 and includes a base plate connecting two opposite sidewalls 452a, 452b. The insulating seat 41 is formed with a through hole 420 at a bottom of each receiving groove 42. The connecting portion 450 of each receiving terminal 45 passes through a corresponding one of the through holes 420 to form a pin for electrically coupling with the circuit board 90. In addition, the insulating seat 41 is formed with assembly portions 44a, 44b in which the latches 43a, 43b are inserted, respectively, so as to fix the latches 43a, 43b in position to the insulating seat 41.

The sockets 40, 50 have the same structure. The socket 50 includes an insulating seat 51, a plurality of receiving terminals 55, and two latches 53a, 53b. The insulating seat 51 is formed with a plurality of rectangular receiving grooves 52 arranged at intervals so as to secure the receiving terminals 55 in position, respectively. Each receiving terminal 55 is electrically conductive and includes a connecting portion 550 and a conducting portion 551. The connecting portion 550 is configured for electrically coupling with transmission lines of the circuit board 93. The conducting portion 551 is configured to substantially conform to the shape of the rectangular receiving groove 52 and includes a base plate connecting two opposite sidewalls 552a, 552b. The insulating seat 51 is formed with a through hole 520 at a bottom of each receiving groove 52. The connecting portion 550 of each receiving terminal 55 passes through a corresponding one of the through holes 520 to form a pin for electrically coupling with the circuit board 93. The insulating seat 51 is further formed with assembly portions 54a, 54b in which the latches 53a, 53b are inserted, respectively, so as to fix the latches 53a, 53b in position to the insulating seat 51.

The jumper 30 includes an insulating cover 31, a plurality of jumper terminals 35, and four positioning posts 33a, 33b, 33c, 33d. The insulating cover 31 is formed with a plurality of engaging portions 32 arranged at intervals so as to secure the jumper terminals 35 in position, respectively. The positioning posts 33a, 33b, 33c, 33d are configured to match with the seats 41, 51 and the latches 43a, 43b, 53a, 53b of the sockets 40, 50 and thereby assist in securing the jumper 30 in position to the sockets 40, 50 and preventing the jumper 30 from falling off.

Each jumper terminal 35 is electrically conductive and includes a frame 350 and two resilient portions 351a, 351b. The resilient portions 351a, 351b are provided at two ends of the frame 350, respectively, and extend bilaterally outward from the frame 350. The frame 350 is provided with a mating portion 352 configured to match with the engaging portion 32 and thereby assist in securing the jumper terminal 35 in position to the insulating cover 31.

When the sockets 40, 50 are disposed on the adjacent circuit boards 90, 93, respectively, the conducting portions 451, 551 of each two adjacent receiving terminals 45, 55 of the sockets 40, 50 jointly form an accommodating space 49. Each jumper terminal 35 is configured for being received in the accommodating space 49 such that the frame 350 extends through the adjacent conducting portions 451, 551. With a view to compensating for a positional offset between the receiving terminals 45, 55, the frame 350 has a width smaller than a spacing between the sidewalls 452a, 452b. Thus, the resilient portion 351a extends toward and presses against the sidewalls 452a, 452b, respectively, and the resilient portion 351b extends toward and presses against the sidewalls 552a, 552b, respectively, thereby electrically connecting the adjacent receiving terminals 45, 55. As shown in the drawings, the jumper terminal 35 is stamped from a metal so as to have a special semi-columnar structure. The resilient portions 351a, 351b are connected at the two ends of the frame 350 and each is composed of two resilient arms. The resilient arms are bent outward from the frame 350. In other embodiments, however, the resilient portions 351a, 351b can be implemented in many different ways, such as by resilient flaps.

It should be specifically pointed out that, in order to compensate for a positional offset between the sockets 40, 50, the positioning posts 33a, 33b, 33c, 33d of the cover 31 of the jumper 30 and the latches 43a, 43b, 53a, 53b of the seats 41, 51 are not dimensioned for a tight fit but for a loose fit therebetween, i.e., with gaps existing between the positioning posts 33a, 33b, 33c, 33d and the latches 43a, 43b, 53a, 53b, respectively, so as to absorb the positional offset and prevent the circuit boards 90, 93 from being pulled by an improper coupling force which may otherwise result from a tight-fit design when the jumper 30 is mated with the sockets 40, 50.

Figure 11:
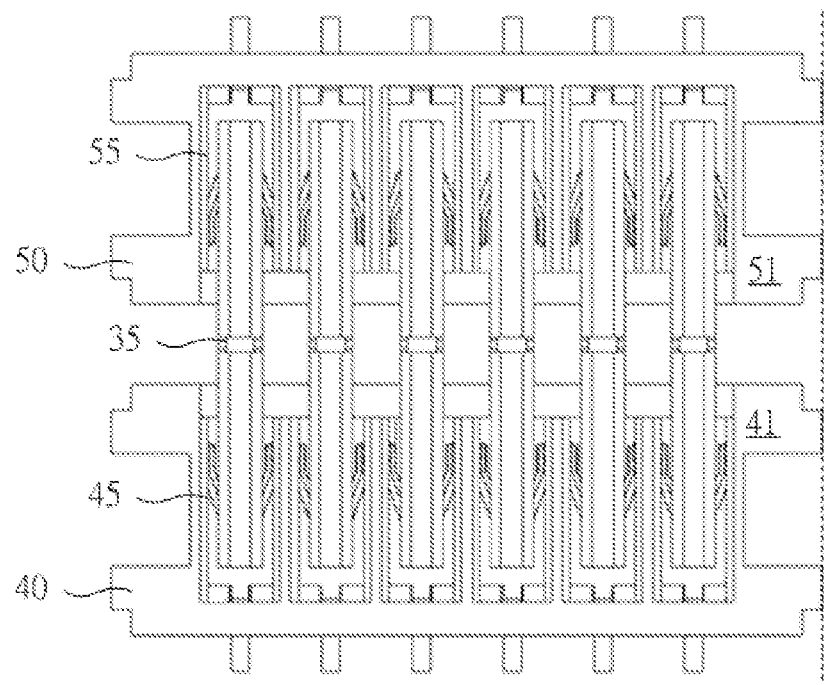
FIGS. 11 and 12 are schematic drawings showing two terminal mating scenarios of the compensating circuit board connector according to the present invention.
Figure 12:
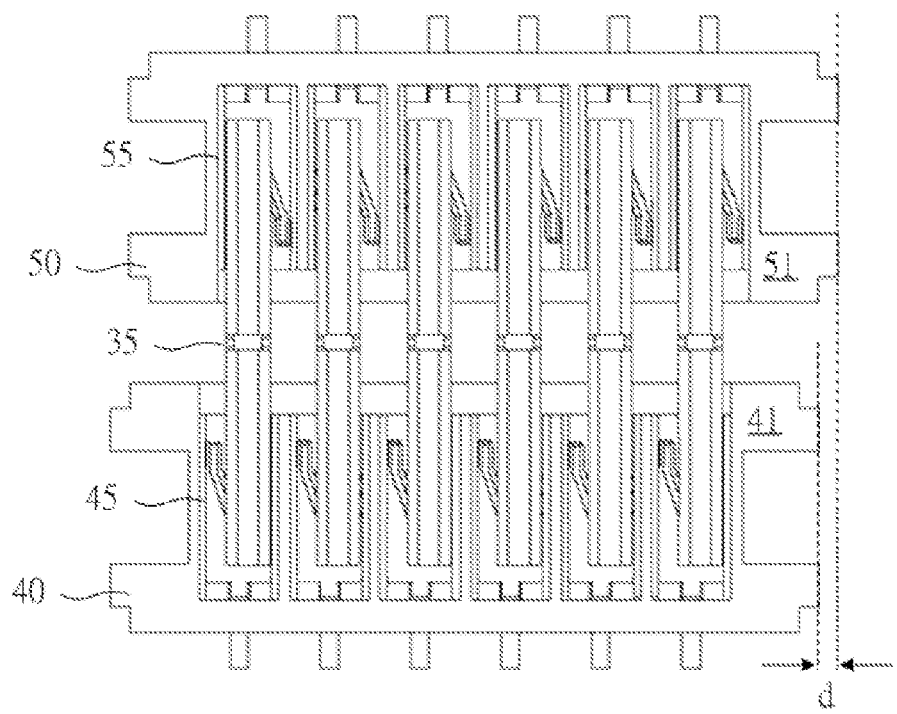

Referring to FIG. 11 and FIG. 12, two terminal mating scenarios of the compensating circuit board connector according to the present invention are provided to demonstrate how the present invention compensates for a positional offset between the sockets. As shown in FIG. 11, the socket 40 is perfectly aligned with the socket 50, so there is no positional offset therebetween. In this scenario, each of the two ends of each jumper terminal 35 presses resiliently against the two sidewalls of the corresponding receiving terminal 45 or 55. In FIG. 12, however, a positional offset d exists between the sockets 40, 50 such that one end of each jumper terminal 35 presses tightly against the right sidewall of the corresponding receiving terminal 45 while the other end of each jumper terminal 35 presses tightly against the left sidewall of the corresponding receiving terminal 55.

It is understood that, a person skilled in mechanism design and having reviewed the technical contents disclosed herein should be able to design flexibly the sidewall spacing of the receiving terminal, the frame width and dimensions of the resilient portions of the jumper terminal, and the way in which the resilient portions press against the sidewalls. These alternative designs are not detailed herein for the sake of brevity. Besides, the appended drawings are intended to illustrate the major technical concepts of the present invention but not to limit the scope of the present invention.

It can be known from the above detailed description that the compensating circuit board connector of the present invention can compensate for a positional offset between the sockets and prevent the circuit boards from being pulled or even deformed by an improper coupling force, so as to ensure device reliability.

What is claimed is:

1. A compensating circuit board connector for connecting two adjacent circuit boards, comprising:

two sockets, each comprising at least one receiving terminal, the receiving terminal having a conducting portion and a connecting portion, the conducting portion comprising two opposite sidewalls, wherein the two sockets are disposed on the two circuit boards, respectively, via the connecting portions of the receiving terminals such that the conducting portions of the receiving terminals of the two sockets jointly form an accommodating space; and a jumper, mated with the two sockets, the jumper comprising at least one jumper terminal configured for being received in the accommodating space, the jumper terminal comprising a frame and two resilient portions, the frame extending through the conducting portions of the receiving terminals of the two sockets and having a width smaller than a spacing between the two opposite sidewalls of the receiving terminal of each said socket, the two resilient portions being provided at two ends of the frame, respectively, and extending outward such that each said resilient portion presses against the two opposite sidewalls of a corresponding said receiving terminal.

2. The compensating circuit board connector of claim 1, wherein each said resilient portion of the jumper terminal comprises two resilient arms, the two resilient arms extending from the frame toward the two opposite sidewalls of a corresponding said receiving terminal, respectively.

3. The compensating circuit board connector of claim 1, wherein each said socket further comprises an insulating seat for securing a corresponding said receiving terminal in position.

4. The compensating circuit board connector of claim 3, wherein the insulating seat is provided with at least one receiving groove for securing the corresponding receiving terminal in position.

5. The compensating circuit board connector of claim 4, wherein the insulating seat is formed with a through hole at the receiving groove, so as for the connecting portion of the corresponding receiving terminal to pass through the through hole and form a pin.

6. The compensating circuit board connector of claim 1, wherein the jumper further comprises an insulating cover for securing the jumper terminal in position.

7. The compensating circuit board connector of claim 6, wherein the insulating cover is provided with at least one engaging portion for securing the jumper terminal in position.

8. The compensating circuit board connector of claim 7, wherein the frame of the jumper terminal further comprises a mating portion for being inserted in the engaging portion.

9. The compensating circuit board connector of claim 3, wherein each said socket further comprises a latch provided at the insulating seat, so as to assist in assembling the insulating cover to the insulating seats.

10. The compensating circuit board connector of claim 9, wherein each said insulating seat is provided with an assembly portion for securing a corresponding said latch in position to the insulating seat.

11. The compensating circuit board connector of claim 9, wherein the jumper further comprises a positioning post provided at the insulating cover and configured to match with the insulating seats and the latches, so as to assist in assembling the insulating cover to the insulating seats.

12. The compensating circuit board connector of claim 11, wherein a gap exists between the positioning post and the latches when the insulating cover is assembled to the insulating seats.

* * * * *